United States Patent [19]

Furihata et al.

[11] 4,136,289
[45] Jan. 23, 1979

[54] PHASE CONTROL CIRCUIT AND OSCILLATOR CIRCUIT USING IT

[75] Inventors: Makoto Furihata, Kokubunji; Shigeaki Minamihata, Fuchu; Takao Yokoyama, Kodaira, all of Japan

[73] Assignee: Hitachi, Ltd., Japan

[21] Appl. No.: 771,200

[22] Filed: Feb. 23, 1977

[30] Foreign Application Priority Data

Feb. 25, 1976 [JP] Japan .................................. 51-19009

[51] Int. Cl.$^2$ ......................... H03K 1/12; H03K 5/13
[52] U.S. Cl. .................................... 307/262; 307/232; 328/55; 330/261; 329/103
[58] Field of Search ................. 307/232, 262; 329/103; 330/261; 328/55

[56] References Cited

U.S. PATENT DOCUMENTS

| | | | |
|---|---|---|---|
| 3,292,098 | 12/1966 | Bensing | 307/262 |
| 3,673,505 | 6/1972 | Limberg | 307/232 X |
| 3,970,868 | 7/1976 | Clements et al. | 307/232 |
| 4,006,423 | 2/1977 | Kuniyoshi et al. | 329/103 |

Primary Examiner—John S. Heyman
Attorney, Agent, or Firm—Craig & Antonelli

[57] ABSTRACT

A phase control circuit includes a controlled voltage source circuit and a controlled current source circuit receiving a reference frequency signal, a first impedor connected between the controlled voltage source circuit and an output terminal of the phase control circuit, a second impedor connected between a DC power source and the output terminal, and an output control circuit connected between the output terminal and the controlled current source circuit. The oscillator circuit comprises a crystal oscillator, a circuit for amplifying the output of the oscillator and a circuit arrangement almost similar to the phase control circuit in which the reference frequency signal is supplied from the crystal oscillator. The phase control circuit and the oscillator circuit are suited for an integrated circuit construction.

6 Claims, 13 Drawing Figures

PHASE CONTROL CIRCUIT AND OSCILLATOR CIRCUIT USING IT

This invention relates to a phase control circuit and an oscillator circuit using it.

Known phase control circuits are proposed in a plurality of types, such as, an AC type which includes a resistor and a capacitor as its major parts, and a DC type which includes a plurality of differential operation transistor pairs. However, as will be described later, both these types of known phase control circuits have not been fully satisfactory in that the former tends to be easily adversely affected by noise, and the latter requires an increased number of external lead terminals when fabricated into a semiconductor integrated circuit construction although it is hardly adversely affected by noise.

With a view to solve the above problems involved in the known ones, it is an object of the present invention to provide a phase control circuit and an oscillator circuit using it, which require a reduced number of external lead terminals when fabricated into a monolithic semiconductor integrated circuit construction.

Another object of the present invention is to provide an oscillator circuit which requires a reduced number of external parts.

In order that the present invention may be readily carried into effect, it will now be described in detail, by way of example, with reference to the accompanying drawings, in which.

For a better understanding of the present invention, prior art phase control circuits will be described with reference to FIGS. 1 and 2 before describing the present invention in detail.

Figure 1:
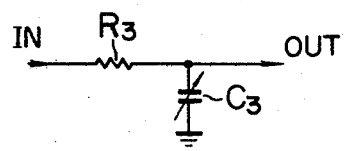
FIGS. 1 and 2 show the structure of prior art phase control circuits.

FIG. 1 shows the structure of a prior art phase control circuit of AC type which includes a resistor $R_3$ and a capacitor $C_3$. In this prior art phase control circuit, the resistance of the resistor $R_3$ or the capacitance of the capcitor $C_3$ is made variable for adjusting the output phase relative to the input phase. (In the illustrated structure, the capacitance of the capacitor $C_3$ is variable.) However, the variable capacitor $C_3$ or variable resistor $R_3$ must be disposed so as to be manipulated on a control panel of a receiver, and a relatively elongated signal conduction line is required for the electrical connection. The prior art phase control circuit of AC type shown in FIG. 1 is therefore defective in that it tends to be easily adversely affected by noise.

Figure 2:
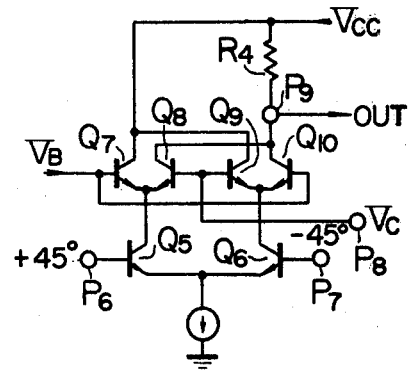

A phase control circuit of DC type is also known and has a structure as shown in FIG. 2. In this prior art phase control circuit of DC type, two signals having different phases, i.e., $+45°$ and $-45°$ are respectively applied to the bases of transistors $Q_5$ and $Q_6$ constituting a differential operation transistor pair, and the collector outputs of these transistors $Q_5$ and $Q_6$ are added in terms of vectors by a gain control circuit constituted by differential operation transistor pairs $Q_7$, $Q_8$ and $Q_9$, $Q_{10}$ for controlling the output phase. In FIG. 2, $R_4$ is an output resistor. $V_B$ and $V_C$ represent a constant bias voltage and a phase control voltage, respectively. The phase control circuit shown in FIG. 2 is advantageous in that it is hardly adversely affected by noise due to the fact that the line for conducting a phase controlling input voltage $V_C$ is isolated from the line for conducting a phase controlled output signal OUT to the output terminal.

However, when this prior art phase control circuit is to be fabricated into a monolithic semiconductor integrated circuit consturction, at least four external lead terminals are required which include a pair of external lead terminals $P_6$ and $P_7$ for applying the two signals having the different phases of $+45°$ and $-45°$, another external lead terminal $P_8$ for applying the phase controlling input voltage $V_c$, and another external lead terminal $P_9$ for delivering the phase controlled output signal OUT.

In a color television receiver, a known 3.58 MHz chrominance subcarrier oscillator circuit is provided for producing the chrominance subcarrier signal in synchronism with the color burst signal contained in a received chroma signal. In this oscillator circuit, its own oscillation frequency is compared with the color burst signal with respect to phase so as to modify the phase of its oscillation output. This known oscillator circuit is of the voltage controlled type, and the aforementioned phase control circuit is used for converting the control voltage applied to the oscillator circuit into a phase control signal. This known oscillator circuit is also defective in that the number of external parts is increased in addition to the similar increase in the number of external lead terminals when it is to be fabricated into a monolithic semiconductor integrated circuit construction.

A preferred basic embodiment of the phase control circuit according to the present invention which obviates the prior art defects will now be described in detail with reference to FIG. 3.

Figure 3:
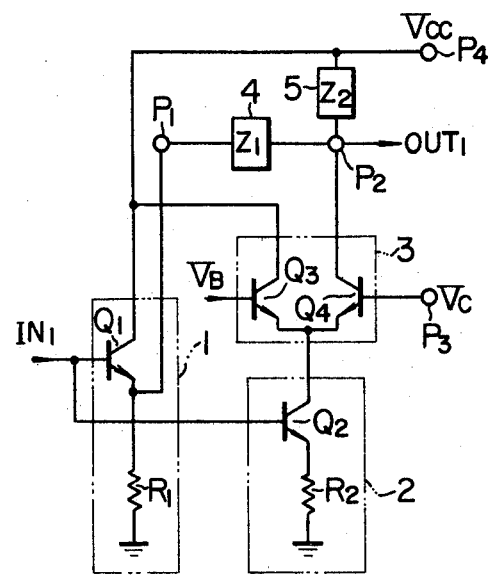
FIG. 3 shows the structure of the phase control circuit embodying one preferred basic form of the present invention.

Referring to FIG. 3, a reference frequency signal $IN_1$ is applied to an emitter follower circuit 1 composed of, for example, a transistor $Q_1$ and a resistor $R_1$. This emitter follower circuit 1 has a low output impedance and is equivalent to a voltage signal source or a controlled voltage source circuit. The reference frequency signal $IN_1$ is also applied to a common-emitter amplifier circuit 2 composed of, for example, a transistor $Q_2$ and a resistor $R_2$. This common-emitter amplifier circuit 2 has a high output impedance and is equivalent to a current signal source or controlled currend source circuit. An output control circuit 3 is connected with the collector of transistor $Q_2$ in this common-emitter amplifier circuit 2 and includes transistors $Q_3$ and $Q_4$ constituting a differential operation transistor pair for dividing the signal appearing at the collector of transistor $Q_2$ and supplying one of the divided signal portions to an output lead terminal $P_2$ of the phase control circuit thereby controlling the output $OUT_1$. A constant bias voltage $V_B$ and a phase control voltage are applied to the base of the transistor $Q_3$ and to the base of the transistor $Q_4$, respectively. An impedor 4 (having an impedance $Z_1$) is connected between an output terminal $P_1$ of the emitter follower circuit 1 and the output lead terminal $P_2$ of the phase control circuit, and another impedor 5 (having an impedance $Z_2$) is connected between a power supply terminal $P_4$ (grounded AC-wise) and the output lead terminal $P_2$, so as to provide a circuit which carries out, in terms of vectors, addition of the output of the controlled current source circuit 2 and the output of the controlled voltage source circuit 1. These impedances $Z_1$ and $Z_2$ consist of mutually different components. For example, when the impedance $Z_1$ (or $Z_2$) includes a resistive component, the impedance $Z_2$ (or $Z_1$) should include an inductive or a capacitive component while when the impedance $Z_1$ (or $Z_2$) includes a capacitive component, the impedance $Z_2$ (or $Z_1$) should have an inductive component.

In the phase control circuit of the present invention having the structure above described, a control voltage $V_c$ applied to the output control circuit 3 through an external lead terminal $P_3$ is varied relative to the reference frequency signal $IN_1$ applied in common to the bases of transistors $Q_1$ and $Q_2$, so that an output signal $OUT_1$ whose phase is varied depending on the variation in the control voltage $V_c$ appears at the output lead terminal $P_2$.

Figure 4:
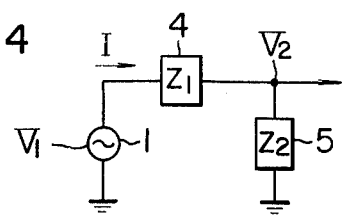
FIGS. 4, 5a and 5b are equivalent circuit diagrams useful for the understanding of the operation of the circuit shown in FIG. 3.
Figure 5A:
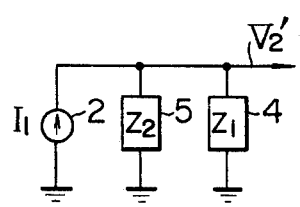
Figure 5B:
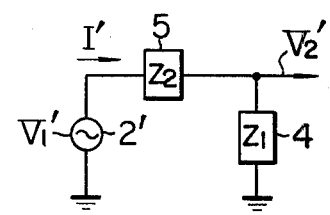

FIG. 4 shows an equivalent circuit of the phase control circuit shown in FIG. 3 when looked from the controlled voltage source circuit 1. It will be seen in FIG. 4 that the impedances 4 and 5 are conencted in series with the controlled voltage source circuit 1 due to the high output impedance of the controlled current source circuit 2. FIG. 5a shows an equivalent circuit of the phase control circuit when looked from the controlled current source circuit 2. It will be seen in FIG. 5a that the impedances 4 and 5 are connected in parallel with the controlled current source circuit 2 due to the low output impedance of the controlled voltage source circuit 1. The equivalent circuit of FIG. 5a may be source-transformed into an equivalent circuit in a voltage source representation as shown in FIG. 5b. It will be understood that the output signal of the phase control circuit can be computed by computing the output $V_2$ of the equivalent circuit of FIG. 4 and the output $V_2'$ of the equivalent circuit of FIG. 5b, and then synthesizing these outputs $V_2$ and $V_2'$ in terms of vectors according to the superposition theorem.

Suppose now that the impedance $Z_1$ consists of a series circuit of a resistance $R_a$ and a capacitance C, and the impedance $Z_2$ consists of a resistance $R_b$. Then, the aforementioned output $V_2$ in FIG. 4 is computed in a manner as described below.

$$V_1 = I(R_a + R_b - j\,1/\omega c) \quad (1)$$

$$V_2 = IR_b \quad (2)$$

From the equation (1), I is given by $$I = \frac{V_1}{R_a + R_b - j\frac{1}{\omega c}}$$

$$= \left[\frac{R_a + R_b}{(R_a + R_b)^2 + \frac{1}{(\omega c)^2}} + j\frac{\frac{1}{\omega c}}{(R_a + R_b)^2 + \frac{1}{(\omega c)^2}}\right]V_1 \quad (3)$$

The value of I given by the equation (3) is introduced into the equation (2) to seek the value of $V_2$ follows:

$$V_2 = \left[\frac{(R_a + R_b)R_b}{(R_a + R_b)^2 + \frac{1}{(\omega c)^2}} + j\frac{\frac{R_b}{\omega c}}{(R_a + R_b)^2 + \frac{1}{(\omega c)^2}}\right]V_1 \quad (4)$$

$$\theta = \tan^{-1}\frac{\frac{1}{\omega c}}{R_a + R_b} \quad (5)$$

It is seen from the equations (4) and (5) that the phase of the output $V_2$ leads that of $V_1$ by $\theta$.

On the other hand, the output $V_2'$ in FIG. 5b is computed in a manner as described below.

$$V_1' = I'(R_a + R_b - j\,1/\omega c) \quad (6)$$

$$V_2' = I'(R_a - j\,1/\omega c) \quad (7)$$

From the equation (6), I' is given by $$I' = \left[\frac{R_a + R_b}{(R_a + R_b)^2 + \frac{1}{(\omega c)^2}} + j\frac{\frac{1}{\omega c}}{(R_a + R_b)^2 + \frac{1}{(\omega c)^2}}\right]V_1' \quad (8)$$

The value of I' given by the equation (8) is introduced into the equation (7) to seek the value of $V_2'$ as follows:

$$V_2' = \left[\frac{R_2 + R_b}{(R_a + R_b)^2 + \frac{1}{(\omega c)^2}} + j\frac{\frac{1}{\omega c}}{(R_a + R_b)^2 + \frac{1}{(\omega c)^2}}\right]$$

$$\times (R_a - j\frac{1}{\omega c})V_1'$$

$$= \left[\frac{(R_a + R_b)R_a + \frac{1}{(\omega c)^2}}{(R_a + R_b)^2 + \frac{1}{(\omega c)^2}} - j\frac{\frac{R_b}{\omega c}}{(R_a + R_b)^2 + \frac{1}{(\omega c)^2}}\right]V_1' \quad (9)$$

$$\theta' = \tan^{-1}\frac{R_b}{\omega c}\bigg/[(R_a + R_b)R_a + \frac{1}{(\omega c)^2}] \quad (10)$$

It is seen from the equations (9) and (10) that the phase of the output $V_2'$ lags behind that of $V_1'$ by $\theta'$.

Figure 6:
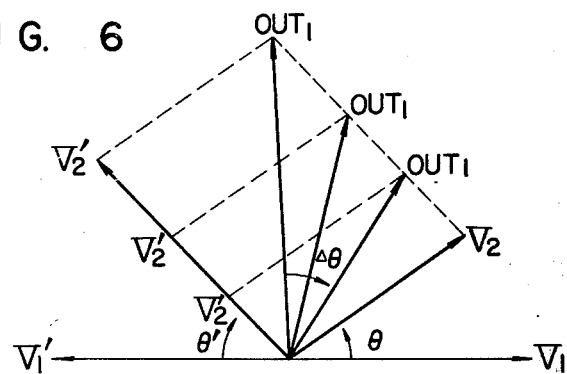
FIGS. 6 to 8 are vector diagrams useful similarly for the understanding of the operation of the circuit shown in FIG. 3.

FIG. 6 is a vector representation of the relation among $V_1$, $V_1'$, $V_2$, $V_2'$ and $OUT_1$. In FIG. 6, the phase of $V_1'$ is opposite to that of $V_1$, because the output $V_1'$ of the common-emitter amplifier circuit providing the controlled current source circuit 2 has the phase opposite to that of the input, and the output $V_1$ of the emitter follower circuit providing the controlled voltage source circuit 1 has the same phase as that of the input.

According to the aforementioned superposition theorem, the output $OUT_1$ is given by the result of addition of the signals $V_2$ and $V_2'$ in terms of vectors as seen in FIG. 6. The level of the output $V_1'$ of the controlled current source circuit 2 can be varied by the output control circuit 3, and the resultant signal $V_2'$ can be varied accordingly. Depending on this variation in the resultant signal $V_2'$, the phase of the output $OUT_1$ can be varied as shown by $\Delta\theta$ in FIG. 6, thereby achieving the desired phase control.

Figure 7:
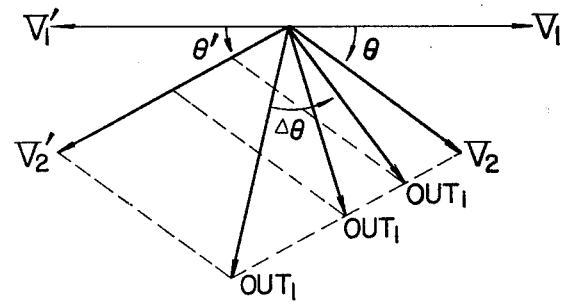

FIG. 7 is a vector diagram representing the case in which the capacitance C in the aforementioned impedance $Z_1$ is replaced by an inductance L. It will be seen in FIG. 7 that the phase of the signal $V_2$ lags behind $V_1$ by $\theta$, and that of the signal $V_2'$ leads $V_1'$ by $\theta'$, with the result that the phase of the output $OUT_1$ varies in a manner as shown by $\Delta\theta$ with the decrease in the level of the signal $V_2'$, that is, such phase varies with a sense opposite to that shown in FIG. 6.

Figure 8:
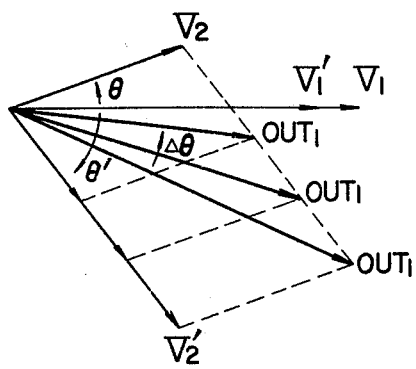

FIG. 8 is a vector diagram representing the case in which the phase of the output $V_1$ of the controlled voltage source circuit 1 is the same as that of the output $V_1'$ of the controlled current source circuit 2, and the impedances $Z_1$ and $Z_2$ remain the same as those described with reference to FIG. 6. In this case too, the phase of the output $OUT_1$ can be advanced with the decrease in the level of the output $V_1'$ of the controlled current source circuit 2 as in the case of FIG. 7.

Figure 9:
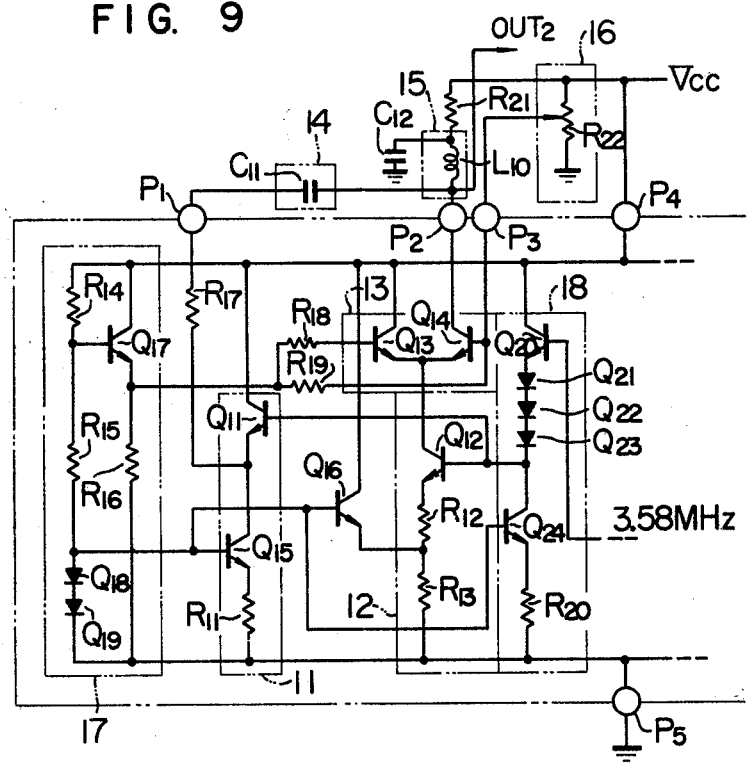
FIG. 9 is a circuit diagram showing the detailed structure of an embodiment of the phase control circuit according to the present invention.

FIG. 9 is a circuit diagram showing the practical structure of an embodiment of the phase control circuit according to the present invention when applied to a hue control circuit in a color television receiver.

In FIG. 9, the portions surrounded by the two-dot chain lines 9 are fabricated into a monolithic semiconductor integrated circuit construction and are connected with external circuits and a power source through external lead terminals $P_1$ to $P_5$.

The blocks 11 to 18 enclosed by the broken lines are principal parts of the hue control circuit, and the blocks 11 to 15 among them correspond respectively to the blocks 1 to 5 in FIG. 3.

Referring to FIG. 9, the block 17 represents a bias circuit which includes resistors $R_{14}$, $R_{15}$ and diodes (or transistors in diode connection) $Q_{18}$, $Q_{19}$ connected in series, another transistor $Q_{17}$ connected at its base with the connection point of the resistors $R_{14}$ and $R_{15}$ and at its collector with the other end of the resistor $R_{14}$ and with the external lead terminal $P_4$ supplying a power supply voltage $V_{cc}$, and another resistor $R_{16}$ connected between the emitter of transistor $Q_{17}$ and the external lead terminal $P_5$ which is grounded. This bias circuit 17 provides a bias voltage for biasing differential operation transistors $Q_{13}$ and $Q_{14}$ constituting an output control circuit represented by the block 13, and it also produces a constant voltage for driving a constant-current transistor $Q_{15}$ in an emitter follower circuit represented by the block 11. The bias voltage for biasing the differential operation transistors $Q_{13}$ and $Q_{14}$ is applied through an emitter follower circuit provided by the transistor $Q_{17}$ and resistor $R_{16}$.

The emitter follower circuit 11 functions as a cotrolled voltage source circuit and includes a transistor $Q_{11}$ which is connected at its emitter with a load including the constant-current transistor $Q_{15}$ and an emitter resistor $R_{11}$ for the transistor $Q_{15}$ for driving the transistor $Q_{15}$ by a constant voltage as described hereinbefore. A 3.58 MHz oscillation signal is applied to the base of the transistor $Q_{11}$ through an amplifying circuit 18 described later, and the emitter output of transistor $Q_{11}$ appears at the external lead terminal $P_1$ through a resistor $R_{17}$. The constant-current circuit consisting of the transistor $Q_{15}$ and resistor $R_{11}$ is used as the emitter load of the transistor $Q_{11}$ in the emitter follower circuit 11 in order to prevent the 3.58 MHz oscillation signal from flowing into the grounded line.

The block 12 represents a common-emitter amplifier circuit which functions as a controlled current source circuit and includes an amplifying transistor $Q_{12}$ and emitter resistors $R_{12}$ and $R_{13}$ therefor. A transistor $Q_{16}$ is connected at its emitter with the connection point of the emitter resistors $R_{12}$ and $R_{13}$ for the transistor $Q_{12}$ and is biased by the constant voltage applied from the bias circuit 17. Thus, this transistor $Q_{16}$ makes differential operation with the transistor $Q_{12}$ so that the 3.58 MHz oscillation signal applied to the base of amplifying transistor $Q_{12}$ may not flow into the grounded line. The signal appearing at the collector of transistor $Q_{12}$ is applied to the external lead terminal $P_2$ through the differential operation transistor circuit functioning as the output control circuit 13. One of the differential operation transistors $Q_{13}$ and $Q_{14}$, for example, the transistor $Q_{14}$ is connected at its base with the external lead terminal $P_3$, and a voltage signal produced by a control section 16 including a variable resistor $R_{22}$ is applied to this external lead terminal $P_3$. Depending on the relative voltage difference between this voltage signal and the bias voltage supplied from the bias circuit 17 through resistors $R_{18}$ and $R_{19}$, the conductance of the differential operation transistors $Q_{13}$ and $Q_{14}$ is varied to control the level of the output of the controlled current source circuit 12.

The block 18 represents an amplifying circuit which supplies the 3.58 MHz oscillation signal to the respective transistors $Q_{11}$ and $Q_{12}$ in the emitter follower circuit 11 and common-emitter amplifier circuit 12. This amplifying circuit 18 comprises an amplifying transistor $Q_{20}$ and its emitter load including diodes (or transistors in diode connection) $Q_{21}$ to $Q_{23}$, a transistor $Q_{24}$ and an emitter resistor $R_{20}$ connected in series. The connection point of the diode $Q_{23}$ and the collector of transistor $Q_{24}$ is connected with the bases of transistors $Q_{11}$ and $Q_{12}$. The diodes $Q_{21}$ to $Q_{23}$ act to shift the output level. The transistor $Q_{24}$ having the emitter resistor $R_{20}$ connected therewith is biased by the constant bias voltage applied from the bias circuit 17. The constant-current circuit is used as the emitter load of the transistor $Q_{20}$ so as to similarly prevent the 3.58 MHz oscillation signal from flowing into the grounded line.

The blocks 14 and 15 represent impedors. In the present embodiment, the impedor 14 consists of a capacitor $C_{11}$ connected between the external lead terminals $P_1$ and $P_2$, and the impedor 15 consists of a resistor $R_{21}$ and an inductor $L_{10}$ connected in series between the power supply terminal $P_4$ and the output lead terminal $P_2$ and a capacitor $C_{12}$ connected between ground and the connection point of the resistor $R_{21}$ and inductor $L_{10}$, so that the phase of the output voltage, transferred from the controlled voltage source circuit 11, appearing at the output lead terminal $P_2$ leads that of the output voltage of the controlled voltage source circuit 11 by 45°, and the phase of the output voltage, transferred from the controlled current source circuit 12, appearing at the output lead terminal $P_2$ is the same as that of the output current of the controlled current source circuit 12.

Figure 11:
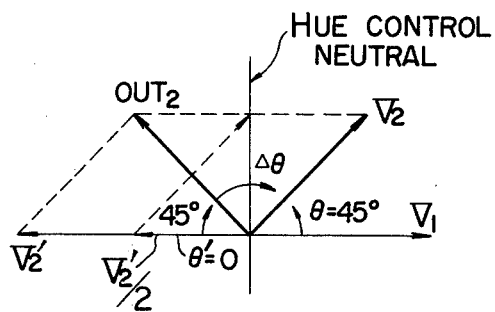
FIG. 11 is a vector diagram useful for the understanding of the operation of the phase control circuit shown in FIG. 9.

FIG. 11 is a vector diagram useful for the understanding of the operation of the phase control circuit shown in FIG. 9. In order that the phase of the output $OUT_2$ lags by 45° when the gain of the common-emitter amplifier circuit is maximum as seen in FIG. 11, the elements $R_{17}$, $R_{21}$, $C_{11}$, $C_{12}$ and $L_{10}$ above described may have the following values:

| | |
|---|---|
| $R_{17} = 1.5\ k\Omega$ | $R_{21} = 180\ \Omega$ |
| $R_{11} = 33\ pF$ | $C_{12} = 0.015\ \mu F$ |
| $E_{10} = 68\ \mu F$ | |

It should be noted here that the capacitor $C_{12}$ serves to ground one end of the inductor $L_{10}$ AC-wise and forms a decoupling circuit along with the resistor $R_{21}$ with respect to the 3.58 MHz signal while the capacitor $C_{11}$ and the inductor $L_{10}$ form a resonant circuit having a resonant frequency equal to 3.58 MHz, i.e., the frequency of the input signal to the transistor $Q_{20}$, in order to make the phase of the output voltage of the controlled current source circuit 12 identical with that of the output current flowing to the output terminal $P_2$ from the controlled current source circuit 12. As a result, the voltages $V_2$ and $V_2'$ are produced, the former 45° phase-leading the 3.58 MHz signal applied to the base of the transistor $Q_{20}$, the latter being in opposite phase to the said 3.58 MHz signal, as shown in FIG. 11. Thus, it is possible to produce the output signal $OUT_2$ having a phase lagging behind $V_2'$ when the gain of the amplifier circuit 12 is maximum, as described above. This circuit construction is advantageous in that the range of phase control can be considerably wide when the output $OUT_2$ is required to have a maximum phase leading by 90° with respect to that of the 3.58 MHz signal applied to the base of the transistor $Q_{20}$.

Although not show in FIG. 9, a capacitor of 0.01 $\mu F$ and a resistor of 3 $k\Omega$ are connected in series between the output lead terminal $P_2$ and the ground.

It will be seen in FIG. 11 that the output $V_2$ of the emitter follower circuit 11 leads by 45°, and the output $V_2'$ of the common-emitter amplifier circuit 12 has a level which is $\sqrt{2}$ times that of the output $V_2$. The above output $V_2'$ is varied within the range of $V_2'$ to 0 by the output control circuit 13 so as to control the phase of the output $OUT_2$ of the phase control circuit within the range of 90° (that is, the range of ±45° on opposite sides of the hue control neutral).

The phase control circuit embodying the present invention is advantageous over the piror art equivalent of DC type in that the number of external lead terminals can be reduced to three. The present invention is also advantageous in that the circuit has a very simple construction since the two signals shown in FIG. 2 are utterly unnecessary.

Figure 12:
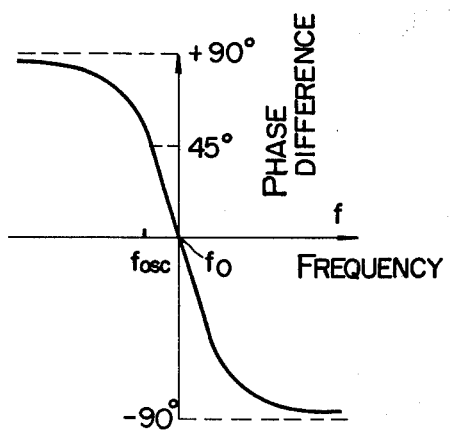
FIG. 12 shows the relation between the phase difference and the oscillation frequency of a crystal oscillator useful for the understanding of the operation of the oscillator circuit shown in FIG. 10.

It will be understood from the foregoing detailed description that the phase control circuit according to the present invention provides an output whose phase varies depending on a control voltage signal input. This fact can be utilized to provide a voltage controlled oscillator circuit. As is commonly known, there is the relation shown in FIG. 12 between the phase difference and the oscillation frequency of a crystal oscillator. The graph shown in FIG. 12 teaches the fact that the oscillation frequency varies depending on the phase difference between signals applied to the electrodes of the crystal oscillator. The crystal oscillator oscillates with its natural frequency $f_o$ in the absence of any phase difference, and the oscillation frequency shifts to $f_{osc}$ when, for example, the phase difference is +45°.

Figure 10:
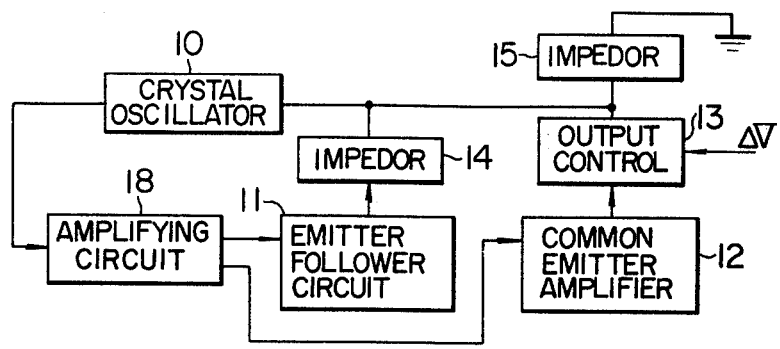
FIG. 10 is a block diagram of an embodiment of the oscillator circuit according to the present invention.

FIG. 10 is a block diagram of an oscillator circuit which comprises the phase control circuit of the present invention including the cotnrolled voltage source circuit 11, controlled current source circuit 12, output control circuit 13, impedors 14; 15, and amplifying circuit 18 shown in FIG. 9. Referring to FIG. 10, a crystal oscillator 10 is connected between an input terminal of the amplifying circuit 18 and the output lead terminal ($P_2$) connected to the connection point of the impedors 14 and 15 so as to oscillate at an oscillation frequency which varies depending on the variation $\Delta V$ of the control voltage applied to the output control circuit 13. The above arrangement provides thus a voltage controlled oscillator circuit. A phase locked loop (PLL circuit) can be obtained when this control voltage is provided by a phase detector whose output is proportional to the phase difference between the oscillation frequency and the reference frequency.

In a practical structure of this oscillator circuit, the crystal oscillator is connected between the output lead terminal $P_2$ and an additional input terminal of the amplifying circuit 18 in FIG. 9. This oscillator circuit is quite simple in construction since a crystal oscillator is merely added to the phase control circuit of simple consrruction having a reduced number of external lead terminals.

While preferred embodiments of the present invention have been described by way of example, it is apparent that the present invention is in no way limited to the specific emobidments, and various changes and modifications may be made therein without departing from the scope of appeanded claims.

We claim:

1. A phase control circuit comprising a controlled voltage source circuit and a controlled current source circuit, an input signal at a reference frequency to the phase control circuit being applicable in common to said source circuits, first and second impedors, one end of said first impedor being connected with one end of said second impedor, and an output control circuit interconnected between said controlled current source circuit and the connected ends of said first and second impedors and arranged to receive a control signal for controlling the phase of the output of the phase control circuit in response to said control signal, the other end of said first impedor being connected with said controlled voltage source circuit and the other end of said second impedor being AC-wise grounded.

2. A phase control circuit according to claim 1, in which said controlled voltage source circuit includes an emitter follower transistor amplifying circuit and said controlled current source circuit includes a common-emitter transistor amplifying circuit.

3. A phase control circuit according to claim 2, in which said output control circuit includes a differential circuit having two input terminals supplied with a reference signal and said control signal, respectively.

4. A phase control circuit according to claim 2, in which said first impedor includes a reactance and said second impedor consists of a resistance.

5. A phase control circuit according to claim 2, in which said first impedor consists of a resistance and said second impedor includes a reactance.

6. A phase control circuit according to claim 1, in which said first and second impedors constitute a resonant circuit having a resonant frequency identical with said reference frequency.

* * * * *